United States Patent
Fan

(10) Patent No.: US 10,601,222 B2
(45) Date of Patent: Mar. 24, 2020

(54) STACKED SYMMETRIC T-COIL WITH INTRINSIC BRIDGE CAPACITANCE

(71) Applicant: QUALCOMM Incorporated, San Diego, CA (US)

(72) Inventor: Siqi Fan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 313 days.

(21) Appl. No.: 15/694,595

(22) Filed: Sep. 1, 2017

(65) Prior Publication Data

US 2019/0074686 A1    Mar. 7, 2019

(51) Int. Cl.
*H02H 9/04* (2006.01)
*H01F 17/00* (2006.01)
*H01F 27/28* (2006.01)
*H01F 27/29* (2006.01)
(Continued)

(52) U.S. Cl.
CPC ......... *H02H 9/046* (2013.01); *H01F 17/0013* (2013.01); *H01F 27/2804* (2013.01); *H01F 27/29* (2013.01); *H01L 27/0288* (2013.01); *H01L 28/10* (2013.01); *H02H 9/044* (2013.01); *H01F 2017/0046* (2013.01); *H01F 2017/0073* (2013.01); *H01F 2017/0086* (2013.01); *H01F 2027/2809* (2013.01)

(58) Field of Classification Search
CPC ..... H02H 9/046; H01F 27/2804; H01F 27/29; H01F 2027/2809
See application file for complete search history.

(56) References Cited

U.S. PATENT DOCUMENTS 7,463,112 B1    12/2008  Groves
8,143,987 B2    3/2012   Kireev
8,395,234 B2    3/2013   Okushima et al.
(Continued)

OTHER PUBLICATIONS

Kim S., et al., "Design of a Reliable Broadband I/O Employing T-Coil", Journal of Semiconductor Technology and Science, Dec. 2009, vol. 9, No. 4, pp. 198-204.
(Continued)

*Primary Examiner* — Scott Bauer
(74) *Attorney, Agent, or Firm* — Arent Fox, LLP and Qualcomm, Incorporated

(57) ABSTRACT

A T-coil IC includes a first inductor on an $M_x$ layer. The first inductor has n turns, where n is at least 1⅞ turns. The T-coil IC further includes a second inductor on an $M_{x-1}$ layer. The second inductor has n turns. The first inductor and the second inductor are connected together at a node. The first inductor on the $M_x$ layer and the second inductor on the $M_{x-1}$ layer are mirror symmetric to each other. The T-coil IC further includes a center tap on an $M_{x-2-y}$ layer, where y≥0. The center tap is connected to the first inductor and the second inductor by a via stack at the node. In one configuration, n is 1⅞+0.5z turns, where z≥0. An effective bridge capacitance of the T-coil IC may be approximately 25 fF.

21 Claims, 8 Drawing Sheets

(51) Int. Cl.
    *H01L 27/02*     (2006.01)
    *H01L 49/02*     (2006.01)

(56)     References Cited

U.S. PATENT DOCUMENTS

| | | |
|---|---|---|
| 9,048,017 B2 | 6/2015 | Kireev |
| 9,502,168 B1 | 11/2016 | Ler et al. |
| 9,508,480 B2 | 11/2016 | Cho |
| 2005/0229126 A1 | 10/2005 | Wang et al. |
| 2006/0250198 A1 | 11/2006 | Meltzer et al. |
| 2011/0049672 A1* | 3/2011 | Okushima ........... H01L 23/5227 |
| | | 257/531 |
| 2011/0133878 A1 | 6/2011 | Chiu et al. |
| 2012/0146741 A1 | 6/2012 | Yen et al. |
| 2012/0275074 A1 | 11/2012 | Dill et al. |
| 2016/0078998 A1 | 3/2016 | Park et al. |
| 2016/0099301 A1 | 4/2016 | Yen et al. |
| 2016/0261256 A1* | 9/2016 | Kawai .................... H04L 25/02 |
| 2016/0276091 A1 | 9/2016 | Zhang et al. |
| 2017/0076853 A1 | 3/2017 | Valentin |
| 2017/0111995 A1* | 4/2017 | Nishikawa ............ H01F 27/255 |
| 2017/0365389 A1 | 12/2017 | Yosui et al. |
| 2018/0006626 A1 | 1/2018 | Lyalin et al. |
| 2019/0074129 A1 | 3/2019 | Fan et al. |
| 2019/0074687 A1 | 3/2019 | Fan et al. |

OTHER PUBLICATIONS

International Search Report and Written Opinion—PCT/US2018/046478—ISA/EPO—dated Nov. 13, 2018.

\* cited by examiner

STACKED SYMMETRIC T-COIL WITH INTRINSIC BRIDGE CAPACITANCE

BACKGROUND

Field

The present disclosure relates generally to a T-coil design, and more particularly, to a stacked and symmetric T-coil design with an intrinsic built-in bridge capacitance.

Background

As semiconductor integrated circuit (IC) device dimensions decrease and the operating speed of such ICs increases, devices/transistors on an IC become increasingly vulnerable to electrostatic discharge (ESD). Use of a T-coil circuit (also referred to a T-coil network) may provide ESD protection to such devices/transistors. There is currently a need for improvements in the design of the T-coil circuit.

SUMMARY

In an aspect of the disclosure, a T-coil IC includes a first inductor on a metal x ($M_x$) layer. The first inductor has n turns, where n is at least 1⅞ turns. The T-coil IC further includes a second inductor on a metal x−1 ($M_{x-1}$) layer. The second inductor has n turns. The first inductor and the second inductor are connected together at a node. The first inductor on the $M_x$ layer and the second inductor on the $M_{x-1}$ layer are mirror symmetric to each other. The T-coil IC further includes a center tap on a metal x−2−y ($M_{x-2-y}$) layer, where y is greater than or equal to 0. The center tap is connected to the first inductor and the second inductor by a via stack at the node.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As device dimensions decrease and the operating speed of semiconductor ICs increases, devices/transistors on an IC become increasingly vulnerable to ESD. Use of a T-coil circuit may provide ESD protection to such devices/transistors (referred to herein as ESD devices). A T-coil circuit may also improve circuit performance by reducing high frequency signal loss due to ESD capacitance loading. On-chip ESD loading capacitances of high speed input/output (IO) circuits reduce signal bandwidth. A T-coil device may be utilized with inductive peaking from two inductor cores (arms) of both sides of the T-coil to reduce high frequency signal loss due to ESD capacitance loading.

Figure 1:
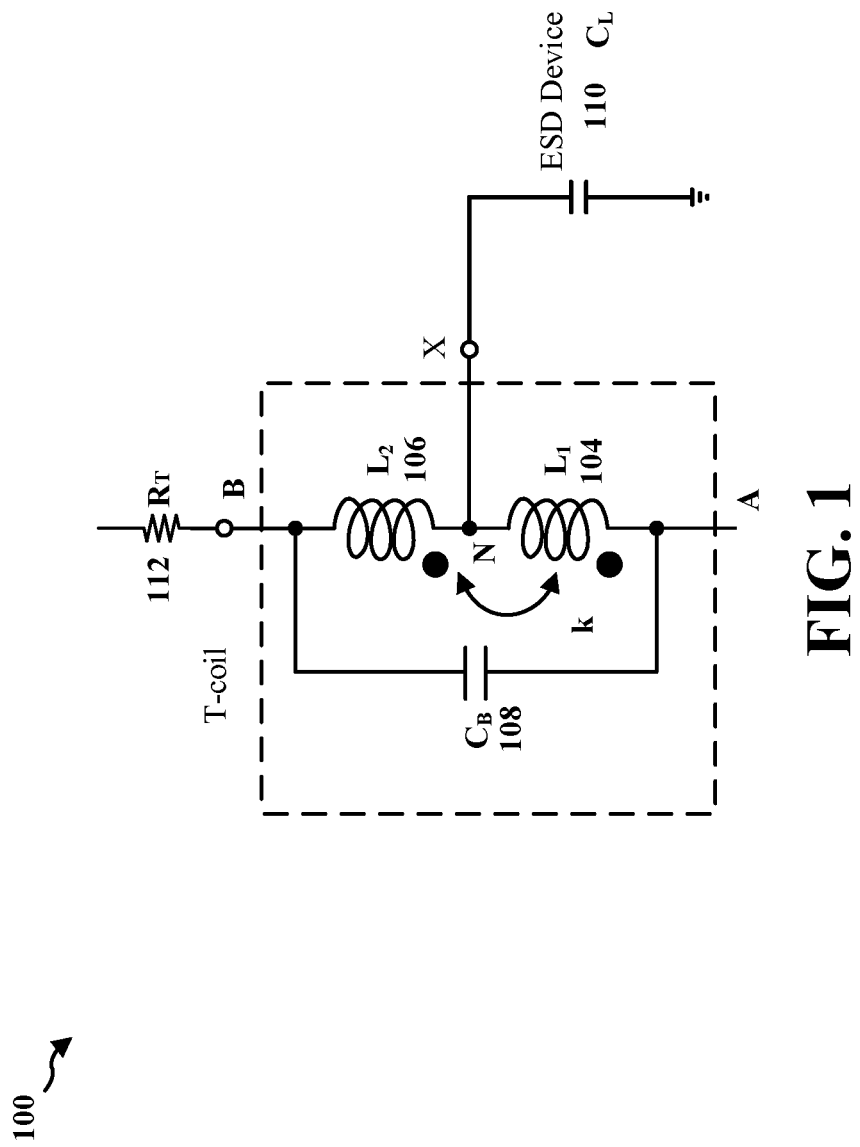
FIG. 1 is a diagram illustrating a T-coil circuit.

FIG. 1 is a diagram illustrating a T-coil circuit 100. As illustrated in FIG. 1, the T-coil circuit 100 includes a first inductor $L_1$ 104 connected between node A and node N and a second inductor $L_2$ 106 connected between node N and node B. The T-coil circuit 100 may further include a bridge capacitance $C_B$ 108. The bridge capacitance $C_B$ 108 may be provided by a bridge capacitor, or in the exemplary configurations as discussed infra, through an intrinsic/built-in (plate-to-plate) capacitance of the T-coil circuit 100. As discussed infra, the intrinsic/built-in capacitance of the T-coil circuit 100 may be in overlapping coil portions of the first and second inductors $L_1$, $L_2$. The node N may be connected to an ESD device 110 with a capacitance $C_L$. The node B may be connected to a termination resistor $R_T$ 112. A resistance of the termination resistor $R_T$ is set for impedance matching. The node A may be connected to an input/output pad. The T-coil circuit 100 has a magnetic coupling coefficient k (also referred to as a coupling factor) between the two coils of the first and second inductors $L_1$, $L_2$, where $k=(4\zeta^2-1)/(4\zeta^2+1)$ and $\zeta$ is a damping coefficient of the T-coil transfer function (the T-coil transfer function behaves like a $2^{nd}$ order lower pass filter and is equal to $V_X/I_A$—voltage at X divided by input current at A). The magnetic coupling coefficient k may be controlled through the damping coefficient $\zeta$. A magnetic coupling coefficient k of 0.5 may be best for group delay (output waveform identical to input waveform in the time domain), and a magnetic coupling coefficient k of 0.333 may be best for bandwidth extension. The T-coil may be designed such that the inductance $L=(0.5C_L R_T^2)(1+k)$ and the effective bridge capacitance $C_B=(1-k)C_L/4(1+k)$ to minimize return loss/reflections and to improve the performance/bandwidth/group delay. Setting $C_B$ as indicated minimizes T-coil return loss.

Figure 2:
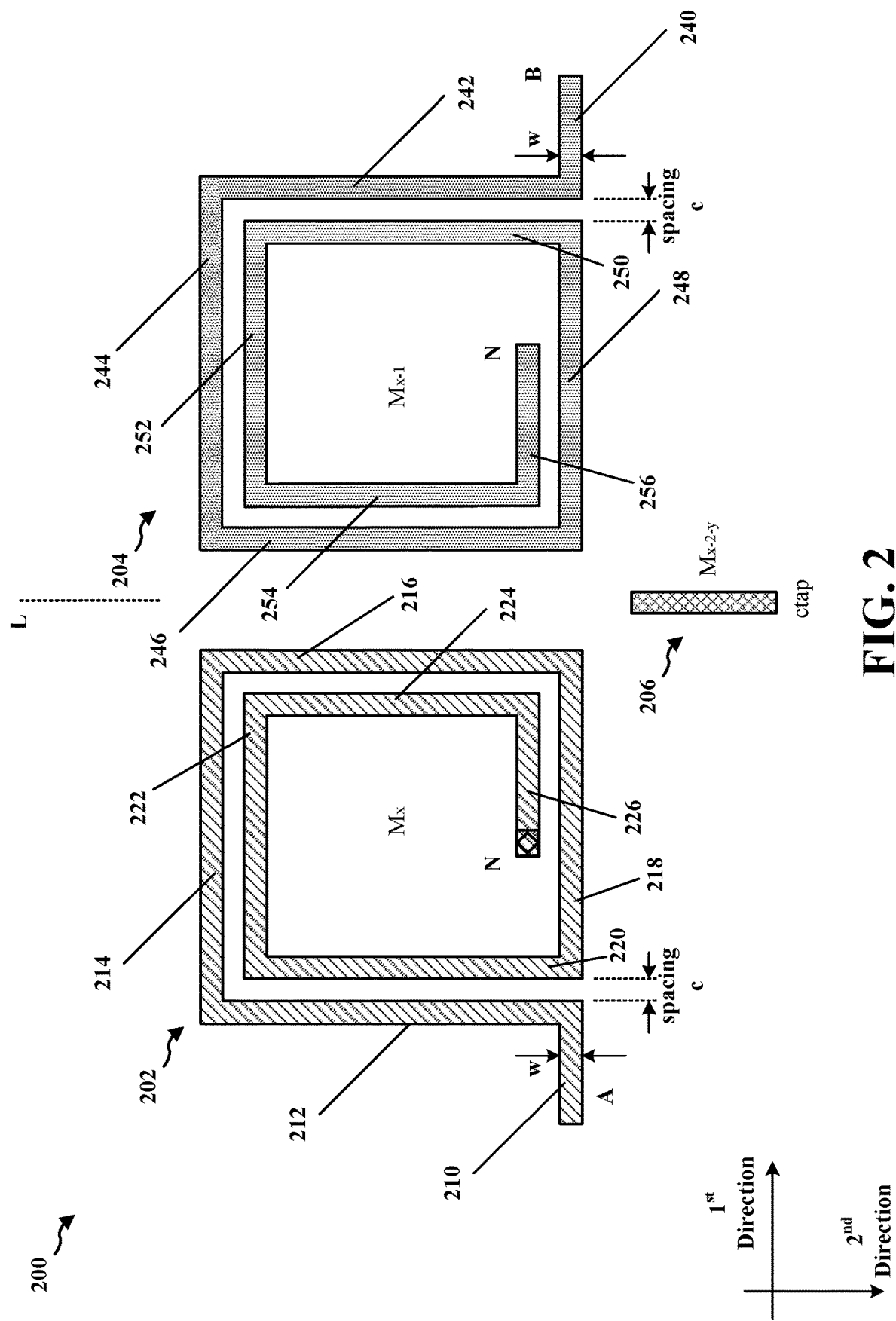
FIG. 2 is a diagram illustrating different layers of a first exemplary T-coil IC.

FIG. 2 is a diagram 200 illustrating different layers of a first exemplary T-coil IC. The first exemplary T-coil IC includes a first inductor core 202 on a metal x ($M_x$) layer, a second inductor core 204 on a metal x−1 ($M_{x-1}$) layer, and a center tap 206 on a metal x−2−y ($M_{x-2-y}$) layer. The first inductor core 202 has 1⅞ turns and includes segments 210, 212, 214, 216, 218, 220, 222, 224, 226. As illustrated in FIG. 2, in a first configuration, the segments 212, 214, 216, 218, 220, 222, 224, 226 may have turns (may coil) in a clockwise direction from A to node N. However, in a second configuration, the first inductor core 202 may have turns in a counter-clockwise direction from A to node N. The segment 210 is illustrated extending orthogonal to the segment 212 in the first direction. However, the segment 210 may be co-linear with the segment 212 in the second direction. The second inductor core 204 has 1⅞ turns and includes segments 240, 242, 244, 246, 248, 250, 252, 254, 256. As illustrated in FIG. 2, in a first configuration, the segments 242, 244, 246, 248, 250, 252, 254, 256 may have turns (may coil) in a clockwise direction from node N to B. However, in a second configuration, the second inductor core 204 may have turns in a counter-clockwise direction from node N to B. The segment 240 is illustrated extending orthogonal to the segment 242 in the first direction. However, the segment 240 may be co-linear with the segment 242 in the second direction. The first and second inductor cores 202, 204 are mirror symmetric with respect to each other. That is, the first inductor core 202 and the second inductor core 204 exhibit mirror symmetry (also referred to as reflection symmetry, line symmetry, or mirror-image symmetry) about any line L extending in the second direction. The center tap 206 may be on an $M_{x-2-y}$ layer, where y is an integer greater than or equal to 0. In one configuration, y is one of 0, 1, 2, or 3. The center tap 206, the first inductor core 202, and the second inductor core 204 may be connected together through a via stack from the $M_x$ layer to the $M_{x-2-y}$ layer. Such a via stack would include alternating layers of metal interconnects and vias between the $M_x$ layer and the $M_{x-2-y}$ layer. For example, assuming y equals 3, the via stack would include an $M_x$ layer interconnect (first inductor core 202 at node N), via $V_{x-1}$, an $M_{x-1}$ layer interconnect (second inductor core 204 at node N), via $V_{x-2}$, an $M_{x-2}$ layer interconnect, via $V_{x-3}$, an $M_{x-3}$ layer interconnect, via $V_{x-4}$, an $M_{x-4}$ layer interconnect, via $V_{x-5}$, and an $M_{x-5}$ layer interconnect (center tap 206 at node N)). On which metal layer the center tap 206 is located may be based on a thickness of metal layers below the $M_{x-1}$ layer. When metal layers below the $M_{x-1}$ layer are too thin to handle the current flowing through the center tap 206, the via stack may include more metal layers (e.g., y may be equal to 2 or 3). When metal layers below the $M_{x-1}$ layer are sufficiently thick to handle the current flowing through the center tap 206, the via stack may include less metal layers (e.g., y may be equal to 0 or 1).

The first inductor core 202 on the $M_x$ layer may be on one metal layer below a redistribution layer (RDL). For example, if the RDL is above a $15^{th}$ metal layer, then x may be 15. The line width w of the first and second inductor cores 202, 204 and the spacing c between turns of the first inductor core 202 on the Mx layer and the second inductor core 204 on the $M_{x-1}$ layer are approximately the same. For example, the line width w of the first and second inductor cores 202, 204 may be 3 μm and the spacing c between neighboring turns for the first and second inductor cores 202, 204 may be 1.4 μm. The first inductor core 202 forms a first inductor $L_1$ and the second inductor core 204 forms a second inductor $L_2$.

Figure 3:
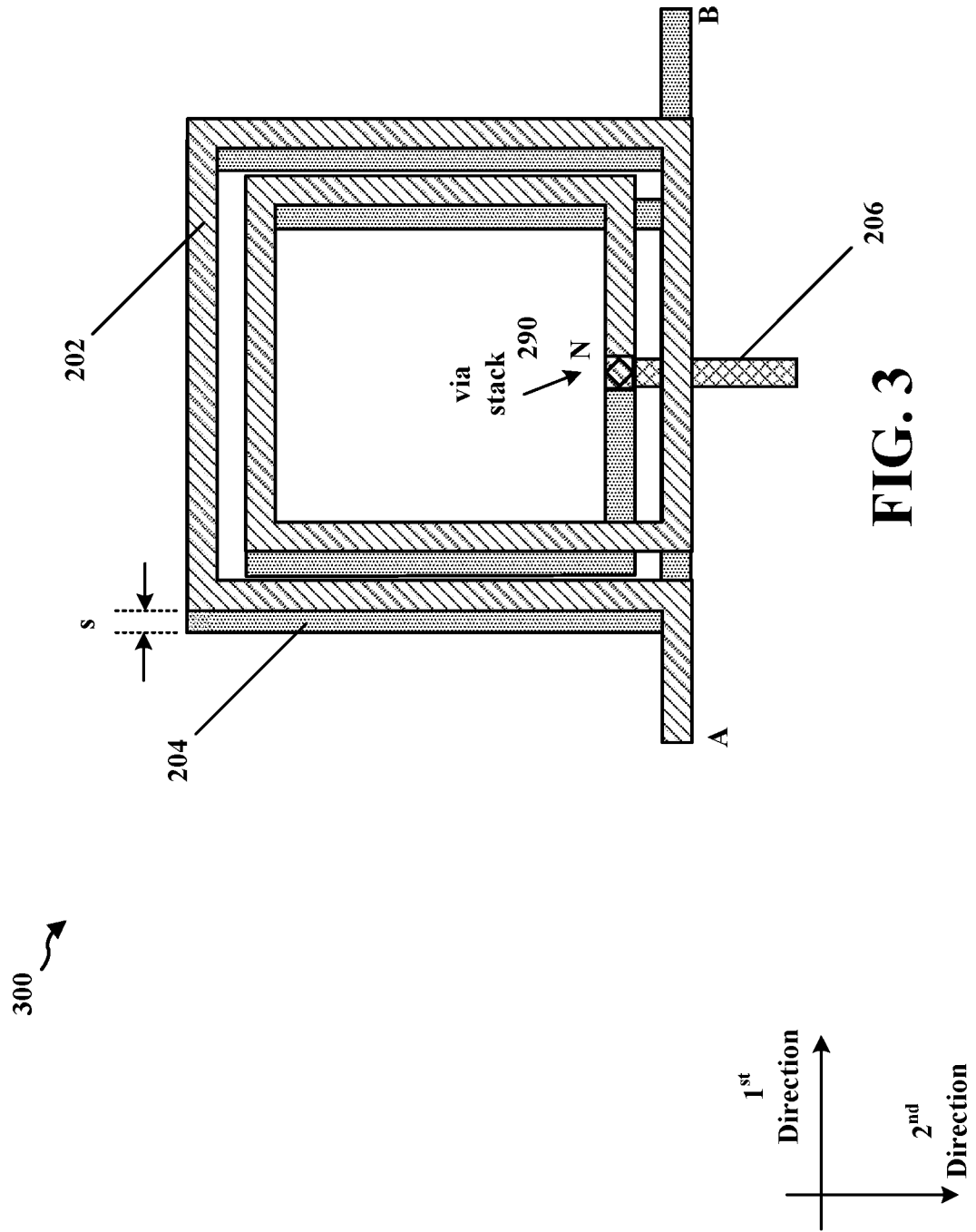
FIG. 3 is a diagram illustrating a plan view of the first exemplary T-coil IC.
Figure 4:
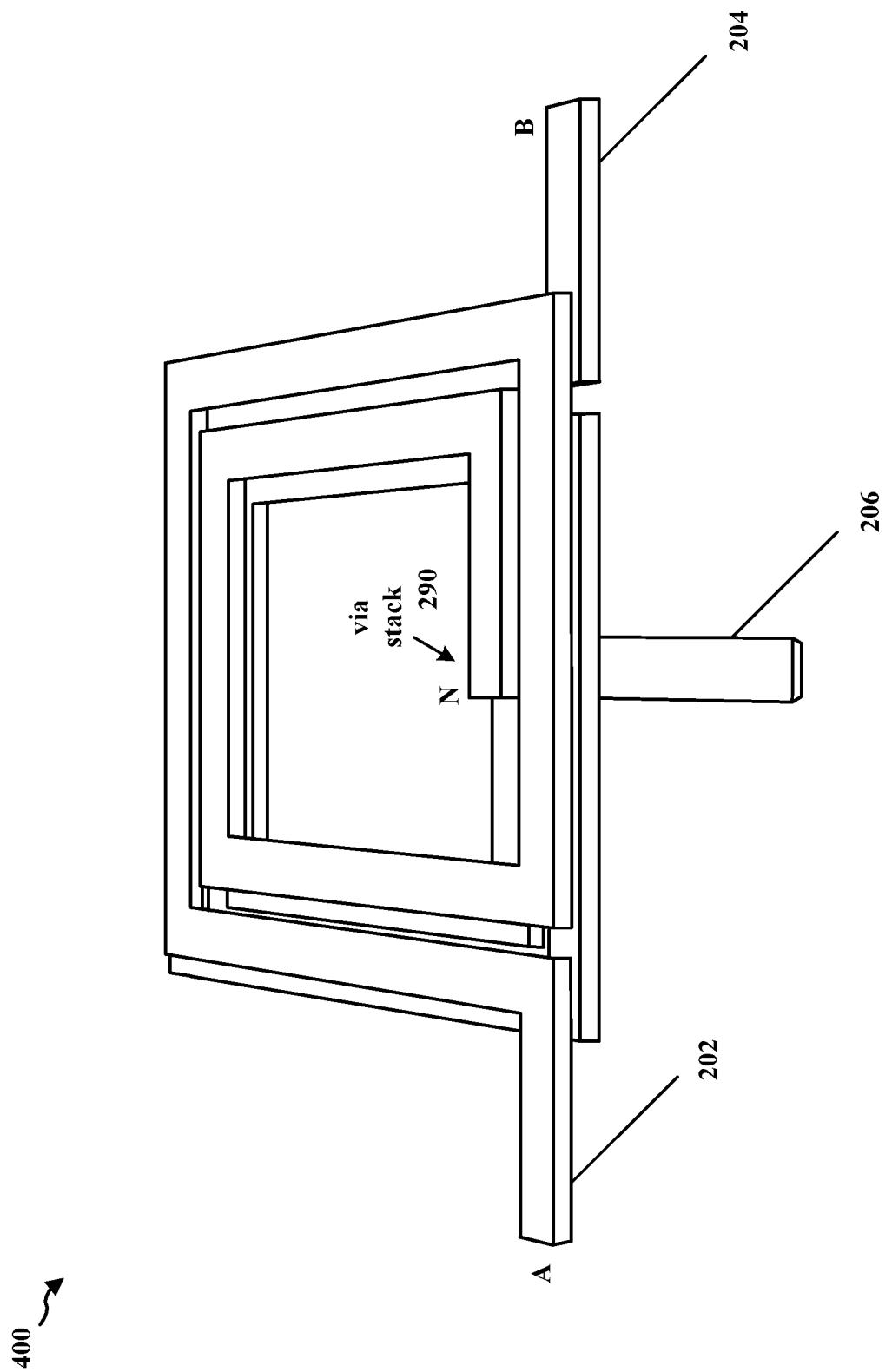
FIG. 4 is a diagram illustrating a 3-dimensional (3D) view of the first exemplary T-coil IC.

FIG. 3 is a diagram 300 illustrating a plan view of the first exemplary T-coil IC. FIG. 4 is a diagram 400 illustrating a 3D view of the first exemplary T-coil IC. As illustrated in FIGS. 3, 4, the first inductor core 202 overlays the second inductor core 204. The first inductor core 202, the second inductor core 204, and the center tap 206 are connected together through a via stack 290. The gap (spacing between the $M_x$ and $M_{x-1}$ layers) between the first and second inductor cores 202, 204 is approximately 0.6 μm to 0.7 μm. Further, as illustrated in FIGS. 3, 4, the first inductor core 202 is shifted in the first direction with respect to the second inductor core 204. The shift of the first inductor core 202 with respect to the second inductor core 204 reduces the coupling coefficient k. In a first configuration, the shift s is approximately 40% to 60% of a line width w of the first and second inductor cores 202, 204. If the line width w is 3 μm, the shift s may be between approximately 1.2 μm and approximately 1.8 μm in the first direction. In a second configuration, the shift s is approximately 50% of a line width w of the first and second inductor cores 202, 204. If the line width w is 3 μm, the shift s may be approximately 1.5 μm in the first direction. As illustrated in FIGS. 2, 3, 4, the T-coil IC is square shaped. However, the T-coil IC may be rectangular, octagonal, or circular.

Figure 5:
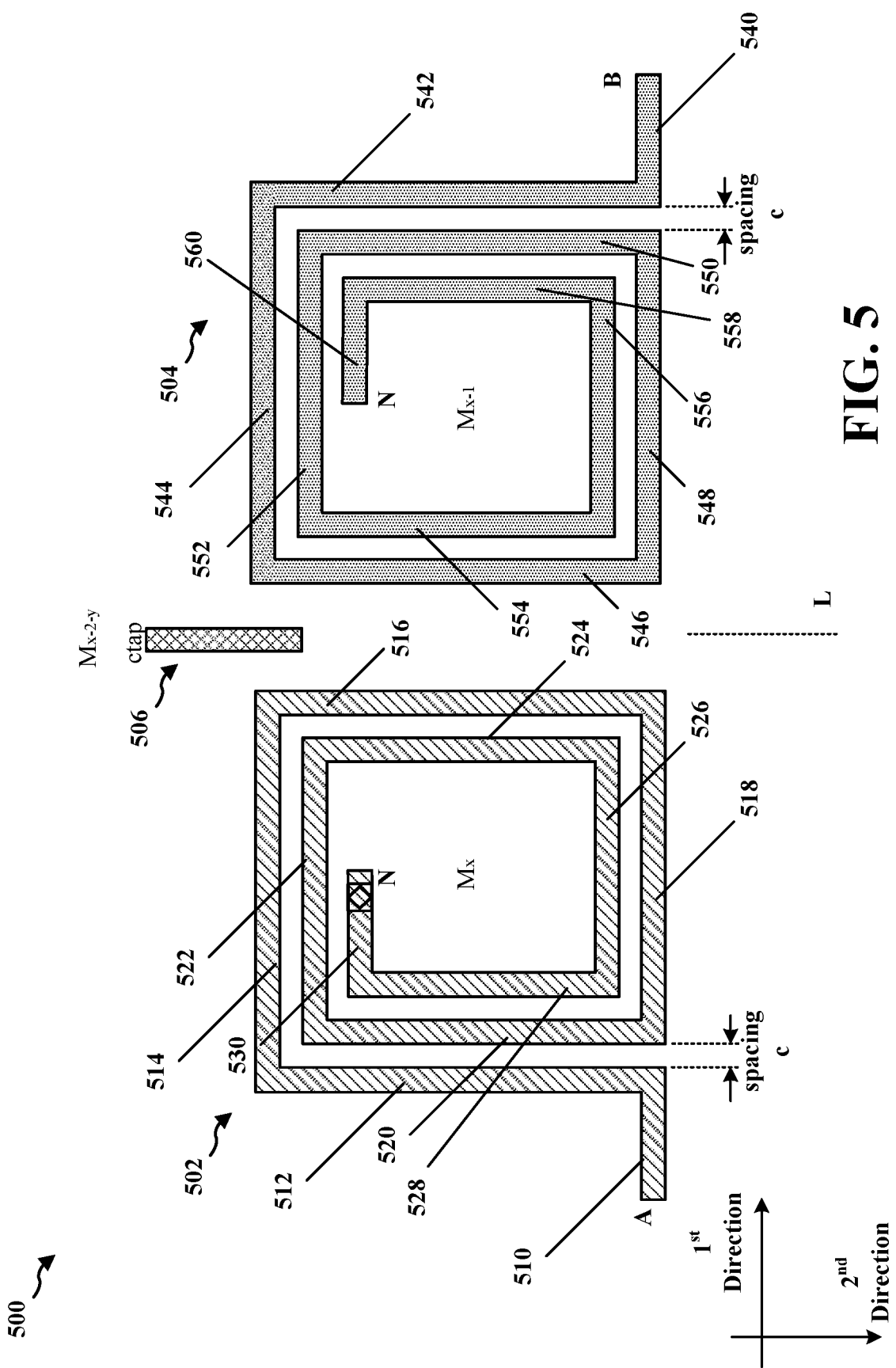
FIG. 5 is a diagram illustrating different layers of a second exemplary T-coil IC.

FIG. 5 is a diagram 500 illustrating different layers of a second exemplary T-coil IC. The second exemplary T-coil IC includes a first inductor core 502 on an $M_x$ layer, a second inductor core 504 on an $M_{x-1}$ layer, and a center tap 506 on an $M_{x-2-y}$ layer. The first inductor core 502 has 2⅜ turns and includes segments 510, 512, 514, 516, 518, 520, 522, 524, 526, 528, 530. As illustrated in FIG. 5, in a first configuration, the segments 512, 514, 516, 518, 520, 522, 524, 526, 528, 530 may have turns (may coil) in a clockwise direction from A to node N. However, in a second configuration, the first inductor core 502 may have turns in a counter-clockwise direction from A to node N. The segment 510 is illustrated extending orthogonal to the segment 512 in the first direction. However, the segment 510 may be co-linear with the segment 512 in the second direction. The second inductor core 504 has 1⅞ turns and includes segments 540, 542, 544, 546, 548, 550, 552, 554, 556, 558, 560. As illustrated in FIG. 5, in a first configuration, the segments 542, 544, 546, 548, 550, 552, 554, 556, 558, 560 may have turns (may coil) in a clockwise direction from node N to B. However, in a second configuration, the second inductor core 504 may have turns in a counter-clockwise direction from node N to B. The segment 540 is illustrated extending orthogonal to the segment 542 in the first direction. However, the segment 540 may be co-linear with the segment 542 in the second direction. The first and second inductor cores 502, 504 are mirror symmetric with respect to each other. That is, the first inductor core 502 and the second inductor core 504 exhibit mirror symmetry about any line L extending in the second direction. The center tap 506 may be on an $M_{x-2-y}$ layer, where y is an integer greater than or equal to 0. In one configuration, y is one of 0, 1, 2, or 3. The center tap 506, the first inductor core 502, and the second inductor core 504 may be connected together through a via stack from the $M_x$ layer to the $M_{x-2-y}$ layer. Such a via stack would include alternating layers of metal interconnects and vias between the $M_x$ layer and the $M_{x-2-y}$ layer. For example, assuming y equal 3, the via stack would include an $M_x$ layer interconnect (first inductor core 502 at node N), via $V_{x-1}$, an $M_{x-1}$ layer interconnect (second inductor core 504 at node N), via $V_{x-2}$, an $M_{x-2}$ layer interconnect, via $V_{x-3}$, an $M_{x-3}$ layer interconnect, via $V_{x-4}$, an $M_{x-4}$ layer interconnect, via $V_{x-5}$, and an $M_{x-5}$ layer interconnect (center tap 506 at node N)). On which metal layer the center tap 506 is located may be based on a thickness of metal layers below the layer. When metal layers below the $M_{x-1}$ layer are too thin to handle the current flowing through the center tap 506, the via stack may include more metal layers (e.g., y may be equal to 2 or 3). When metal layers below the $M_{x-1}$ layer are sufficiently thick to handle the current flowing through the center tap 506, the via stack may include less metal layers (e.g., y may be equal to 0 or 1).

The first inductor core 502 on the $M_x$ layer may be on one metal layer below the RDL. For example, if the RDL is above a $15^{th}$ metal layer, then x may be 15. The line width w and the spacing c between turns of the first inductor core 502 on the Mx layer and the second inductor core 504 on the $M_{x-1}$ layer are approximately the same. For example, a line width w of the first and second inductor cores 502, 504 may be 3 μm and the spacing c between neighboring turns for the first and second inductor cores 502, 504 may be 1.4 μm. The first inductor core 502 forms a first inductor $L_1$ and the second inductor core 504 forms a second inductor $L_2$.

Figure 6:
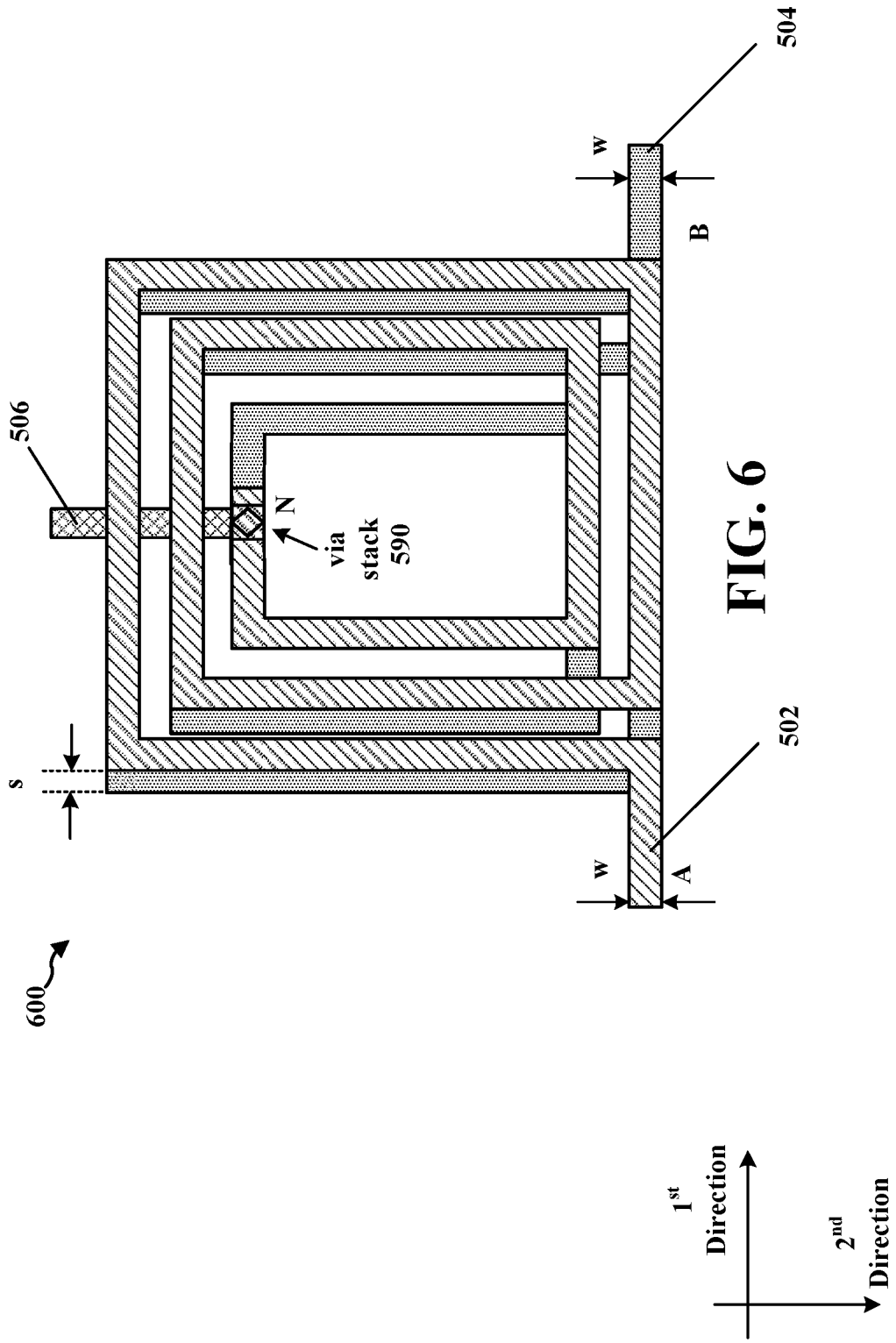
FIG. 6 is a diagram illustrating a plan view of the second exemplary T-coil IC.
Figure 7:
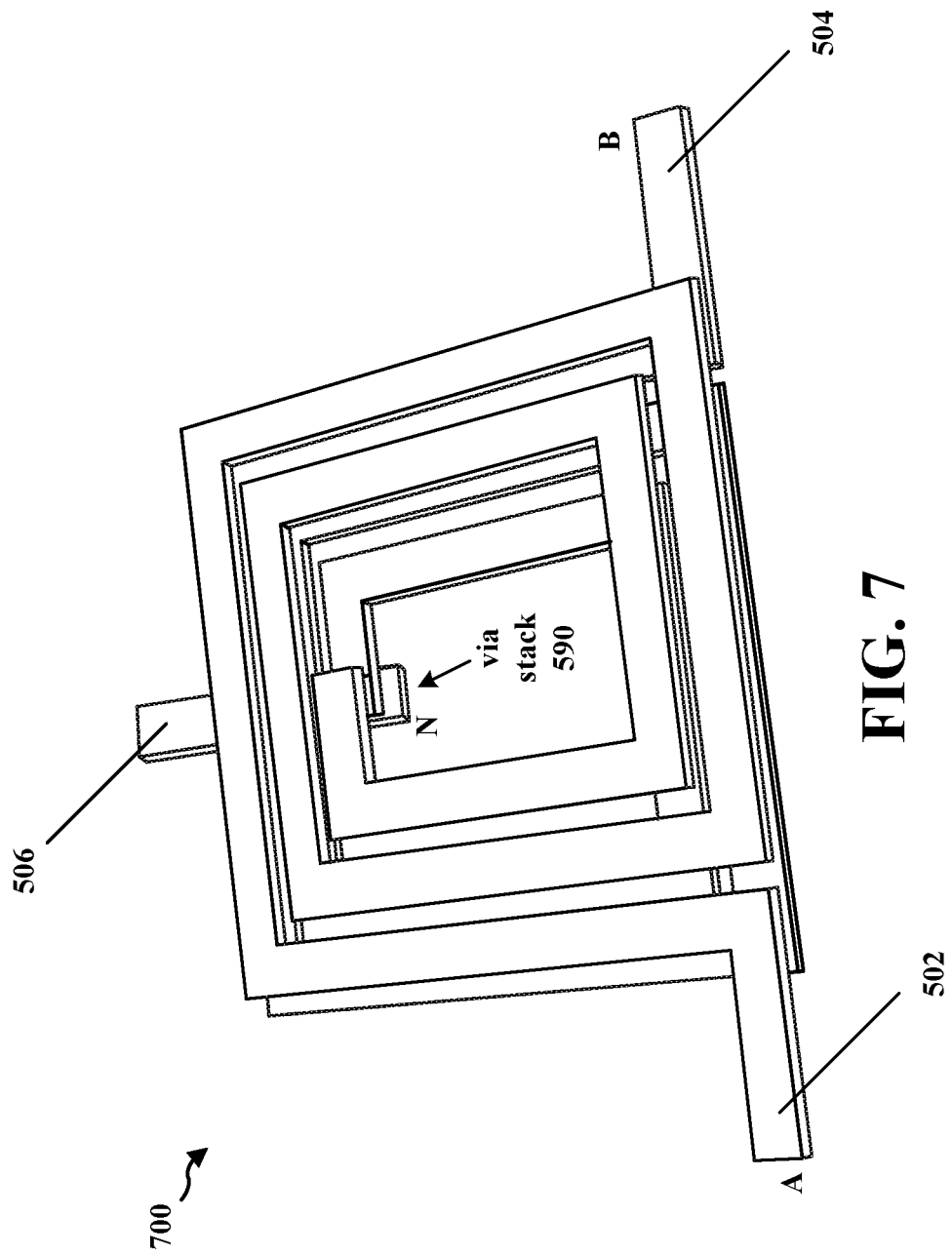
FIG. 7 is a diagram illustrating a 3D view of the second exemplary T-coil IC.
Figure 8:
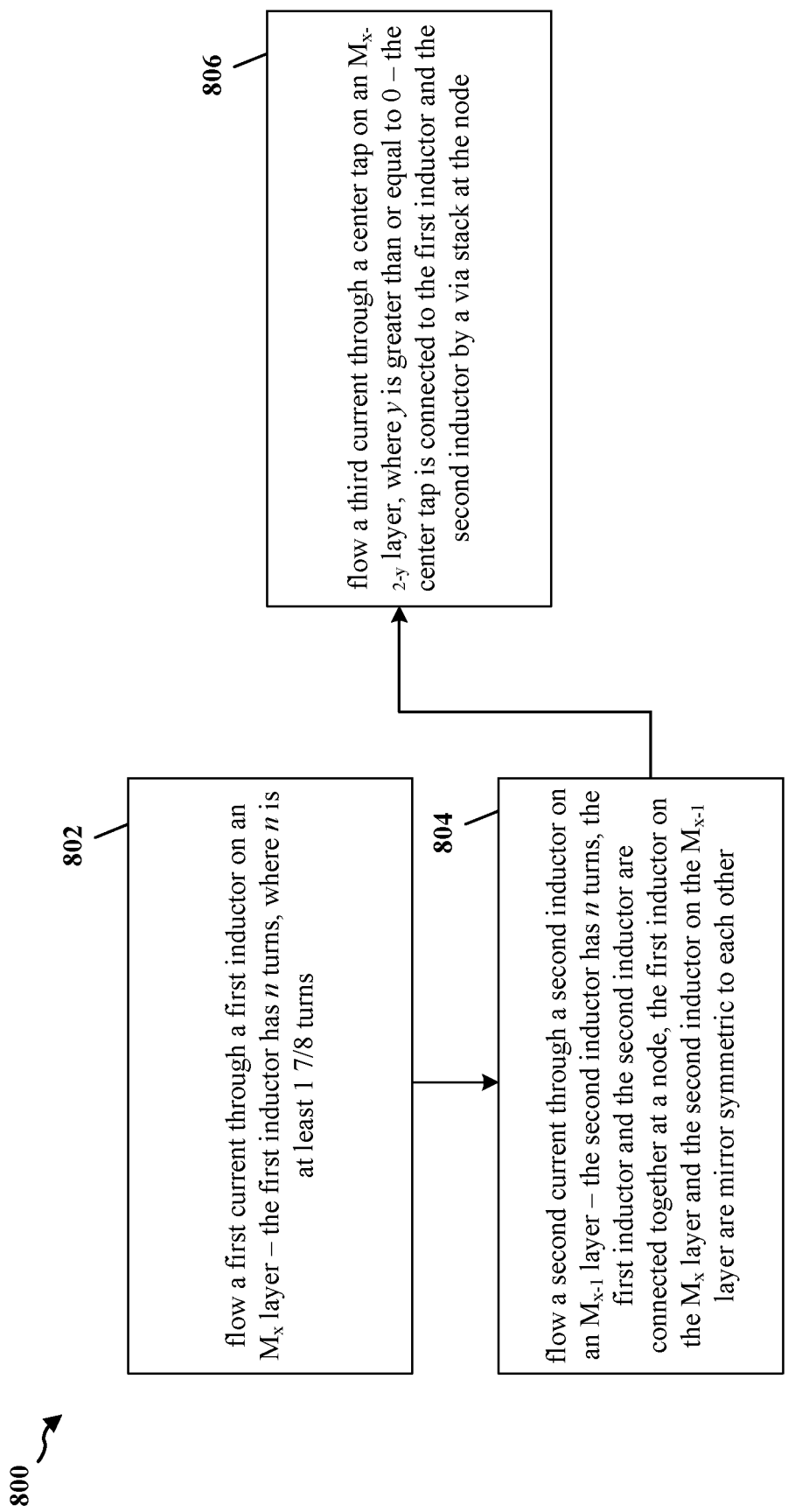
FIG. 8 is a diagram illustrating a method of operation of the first and second exemplary T-coil ICs.

FIG. 6 is a diagram 600 illustrating a plan view of the second exemplary T-coil IC. FIG. 7 is a diagram 700 illustrating a 3D view of the second exemplary T-coil IC. As illustrated in FIGS. 6, 7, the first inductor core 502 overlays the second inductor core 504. The first inductor core 502, the second inductor core 504, and the center tap 506 are connected together through a via stack 590. The gap (spacing between the $M_x$ and $M_{x-1}$ layers) between the first and second inductor cores 502, 504 is approximately 0.6 μm to 0.7 μm. Further, as illustrated in FIGS. 6, 7, the first inductor core 502 is shifted in the first direction with respect to the second inductor core 504. In a first configuration, the shift s is approximately 40% to 60% of a line width w of the first and second inductor cores 502, 504. If the line width w is 3 μm, the shift s may be between approximately 1.2 μm and approximately 1.8 μm in the first direction. In a second configuration, the shift s is approximately 50% of a line width w of the first and second inductor cores 502, 504. If the line width w is 3 μm, the shift s may be approximately 1.5 μm in the first direction. As illustrated in FIGS. 6, 7, 8, the T-coil IC is square shaped. However, the T-coil IC may be rectangular, octagonal, or circular. The square-shaped T-coil IC may have dimensions of about 35 μm×μm 35. For the second exemplary T-coil IC, the magnetic coupling coefficient k is approximately 0.52, a plate-plate capacitance may be about 20 fF, and the estimated intrinsic/built-in bridge capacitance is approximately 25 fF. The intrinsic/built-in capacitance is due to the overlapping coil portions of the first and second inductors $L_1$, $L_2$.

Referring again to FIGS. 1-7, a T-coil IC includes a first inductor 104, 202, 502 on an $M_x$ layer. The first inductor 104, 202, 502 has n turns, where n is at least 1⅞ turns. The T-coil IC further includes a second inductor 106, 204, 504 on an $M_{x-1}$ layer. The second inductor 106, 204, 504 has n turns. The first inductor 104, 202, 502 and the second inductor 106, 204, 504 are connected together at a node N. The first inductor 104, 202, 502 on the $M_x$ layer and the second inductor 106, 204, 504 on the $M_{x-1}$ layer are mirror symmetric to each other. The T-coil IC further includes a center tap 206, 506 on an $M_{x-2-y}$ layer, where y is an integer greater than or equal to 0. The center tap 206, 506 is connected to the first inductor 104, 202, 502 and the second inductor 106, 204, 504 by a via stack (290, 590) at the node N.

In one configuration, n is 1⅞+0.5z turns, where z is an integer greater than or equal to 0. In one configuration, z is equal 0, and the first inductor 104, 202, 502 and the second inductor 106, 204, 504 each have 1⅞ turns. In one configuration, z is equal 1, and the first inductor 104, 202, 502 and the second inductor 106, 204, 504 each have 2⅜ turns.

In one configuration, the first inductor 104, 202, 502 has a first inductor first end at A and a first inductor second end at node N. The first inductor second end at node N is connected to the center tap 206, 506 at the node N. The second inductor 106, 204, 504 has a second inductor first end at node N and a second inductor second end at B. The second inductor first end at node N is connected to the center tap 206, 506 at the node N. In one configuration, the node N at which the center tap 206, 506 is connected to both the first inductor second end at node N and the second inductor first end at node N is located in a central portion within both the first inductor 104, 202, 502 and the second inductor 106, 204, 504. In one configuration, there is no bridge capacitor (see FIG. 1) connected between the first inductor first end at A and the second inductor second end at B, and an effective bridge capacitance of the T-coil IC is approximately 25 fF (see discussion supra in relation to the second exemplary T-coil IC).

In one configuration, y is equal to one of 0, 1, 2, or 3. In one configuration, the first inductor 104, 202, 502 overlays the second inductor 106, 204, 504 with a shift s in a first direction of approximately 40% to 60% of a metal width w of each of the first inductor 104, 202, 502 and the second inductor 106, 204, 504. In one configuration, the shift s in the first direction is approximately 50% of the metal width w of each of the first inductor 104, 202, 502 and the second inductor 106, 204, 504.

In one configuration, the first inductor 104, 202, 502 and the second inductor 106, 204, 504 each include segments that extend in a first direction and in a second direction orthogonal to the first direction. The segments at an edge of the first inductor 104, 202, 502 and the second inductor 106, 204, 504 that extend in the first direction completely overlay each other. The segments at an edge of the first inductor 104, 202, 502 and the second inductor 106, 204, 504 that extend in the second direction overlay each other with a shift of approximately 40% to 60% of a metal width of each of the first inductor 104, 202, 502 and the second inductor 106, 204, 504. In one configuration, the shift is approximately 50% of the metal width of each of the first inductor 104, 202, 502 and the second inductor 106, 204, 504.

In one configuration, the first inductor 104, 202, 502 includes a first inductor first segment 212, 512 extending in a second direction, a first inductor second segment 214, 514 connected to the first inductor first segment 212, 512 and extending in a first direction, a first inductor third segment 216, 516 connected to the first inductor second segment 214, 514 and extending in the second direction, a first inductor fourth segment 218, 518 connected to the first inductor third segment 216, 516 and extending in the first direction, a first inductor fifth segment 220, 520 connected to the first inductor fourth segment 218, 518 and extending in the second direction, a first inductor sixth segment 222, 522 connected to the first inductor fifth segment 220, 520 and extending in the first direction, a first inductor seventh segment 224, 524 connected to the first inductor sixth segment 222, 522 and extending in the second direction, and a first inductor eighth segment 226, 526 connected to the first inductor seventh segment 224, 524 and extending in the first direction. Further, in such a configuration, the second inductor 106, 204, 504 includes a second inductor first segment 242, 542 extending in the second direction, a second inductor second segment 244, 544 connected to the second inductor first segment 242, 542 and extending in the first direction, a second inductor third segment 246, 546 connected to the second inductor second segment 244, 544 and extending in the second direction, a second inductor fourth segment 248, 548 connected to the second inductor third segment 246, 546 and extending in the first direction, a second inductor fifth segment 250, 550 connected to the second inductor fourth segment 248, 548 and extending in the second direction, a second inductor sixth segment 252, 552 connected to the second inductor fifth segment 250, 550 and extending in the first direction, a second inductor seventh segment 254, 554 connected to the second inductor sixth segment 252, 552 and extending in the second direction, and a second inductor eighth segment 256, 556 connected to the second inductor seventh segment 254, 554 and extending in the first direction.

The first inductor first segment 212, 512 primarily overlays the second inductor third segment 246, 546, the first inductor second segment 214, 514 primarily overlays the second inductor second segment 244, 544, the first inductor third segment 216, 516 primarily overlays the second inductor first segment 242, 542, the first inductor fourth segment 218, 518 primarily overlays the second inductor fourth segment 248, 548, the first inductor fifth segment 220, 520 primarily overlays the second inductor seventh segment 254, 554, the first inductor sixth segment 222, 522 primarily overlays the second inductor sixth segment 252, 552, and the first inductor seventh segment 224, 524 primarily overlays the second inductor fifth segment 250, 550.

In one configuration, the first inductor eighth segment 226, 526 and the second inductor eighth segment 256, 556 primarily have no overlay. In one configuration, the first inductor first segment 212, 512 primarily overlays the second inductor third segment 246, 546 with a shift of s % of a metal width w of the first inductor 104, 202, 502 and the second inductor 106, 204, 504, the first inductor second segment 214, 514 primarily overlays the second inductor second segment 244, 544 without a shift, the first inductor third segment 216, 516 primarily overlays the second inductor first segment 242, 542 with the shift of s % of the metal width w of the first inductor 104, 202, 502 and the second inductor 106, 204, 504, the first inductor fourth segment 218, 518 primarily overlays the second inductor fourth segment 248, 548 without a shift, the first inductor fifth segment 220, 520 primarily overlays the second inductor seventh segment 254, 554 with the shift of s % of the metal width w of the first inductor 104, 202, 502 and the second inductor 106, 204, 504, the first inductor sixth segment 222, 522 primarily overlays the second inductor sixth segment 252, 552 without a shift, and the first inductor seventh segment 224, 524 primarily overlays the second inductor fifth segment 250, 550 with the shift of s % of the metal width w of the first inductor 104, 202, 502 and the second inductor 106, 204, 504, where 40%≤s≤60%. In one configuration, s is approximately 50% of the metal width w of the first inductor 104, 202, 502 and the second inductor 106, 204, 504.

In one configuration, the first inductor 104, 202, 502 further includes a first inductor ninth segment 528 connected to the first inductor eighth segment 526 and extending in the second direction, and a first inductor tenth segment 530 connected to the first inductor ninth segment 528 and extending in the first direction. In such a configuration, the second inductor 106, 504 further includes a second inductor ninth segment 558 connected to the second inductor eighth segment 556 and extending in the second direction, and a second inductor tenth segment 560 connected to the second inductor ninth segment 558 and extending in the first direction. The first inductor eighth segment 526 primarily overlays the second inductor eighth segment 556. The first inductor ninth segment 528, the second inductor ninth segment 558, the first inductor tenth segment 530, and the second inductor tenth segment 560 primarily have no overlay. The first inductor eighth segment 526 primarily overlays the second inductor eighth segment 556 without a shift.

In one configuration, x is 15. As discussed supra, x may be one layer below the RDL. In one configuration, the T-coil IC is on an IC, and the center tap 206, 506 is connected to an ESD device on the IC. In one configuration, a coupling coefficient k of the T-coil IC is approximately 0.5. For example, as discussed supra, the coupling coefficient k of the second exemplary T-coil of FIGS. 5, 6, 7 may be approximately 0.52.

FIG. 8 is a diagram 800 illustrating a method of operation of the first and second exemplary T-coil ICs. At 802, a first current flows through a first inductor 202, 502 on an $M_x$ layer. The first inductor 202, 502 has n turns, where n is at least 1⅞ turns. At 804, a second current flows through a second inductor 204, 504 on an $M_{x-1}$ layer. The second inductor 204, 504 has n turns. The first inductor 202, 502 and the second inductor 204, 504 are connected together at a node N. The first inductor 202, 502 on the $M_x$ layer and the second inductor 204, 504 on the $M_{x-1}$ layer are mirror symmetric to each other (about any line L that extends in the second direction). At 806, a third current flows through a center tap 206, 506 on an $M_{x-2-y}$ layer, where y is an integer greater than or equal to 0. The center tap 206, 506 is connected to the first inductor 202, 502 and the second inductor 204, 504 by a via stack 290, 590 at the node N.

In one configuration, a T-coil IC includes means for flowing a first current through a first inductor $L_1$ on an $M_x$ layer. The first inductor $L_1$ has n turns, where n is at least 1⅞ turns. The means for flowing the first current through the first inductor $L_1$ on the $M_x$ layer is the first inductor core 202, 502. The T-coil IC further includes means for flowing a second current through a second inductor $L_2$ on an $M_{x-1}$ layer. The second inductor $L_2$ has n turns. The first inductor $L_1$ and the second inductor $L_2$ are connected together at a node N. The first inductor $L_1$ on the $M_x$ layer and the second inductor $L_2$ on the $M_{x-1}$ layer are mirror symmetric to each other. The means for flowing the second current through the second inductor $L_2$ on the $M_{x-1}$ layer is the second inductor core 204, 504. The T-coil IC further includes means for flowing a third current through a center tap on an $M_{x-2-y}$ layer, where y is an integer greater than or equal to 0. The center tap is connected to the first inductor $L_1$ and the second inductor $L_2$ by a via stack 290, 590 at the node N. The means for flowing the third current through the center tap on the $M_{x-2}$ layer is the center tap 206, 506, which is connected to the first and second inductors $L_1$, $L_2$ through the via stack 290, 590.

Referring again to FIGS. 1-8, the exemplary T-coil ICs eliminate a bridging capacitor in order to provide an area savings. As there is no bridging capacitor, the exemplary T-coil ICs are designed with a sufficient intrinsic/built-in bridging capacitance CB. The intrinsic/built-in capacitance is due to the overlapping coil portions of the first and second inductors $L_1$, $L_2$. The second exemplary T-coil IC provides an intrinsic/built-in bridging capacitance $C_B$ of approximately 25 fF, while the coupling coefficient k is approximately 0.5.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A T-coil integrated circuit (IC), comprising:
a first inductor on a metal x ($M_x$) layer, the first inductor having n turns, where n is at least 1⅞ turns;
a second inductor on a metal x−1 ($M_{x-1}$) layer, the second inductor having n turns, the first inductor and the second inductor being connected together at a node, the first inductor on the $M_x$ layer and the second inductor on the $M_{x-1}$ layer being mirror symmetric to each other; and
a center tap on a metal x−2−y ($M_{x-2-y}$) layer, where y is greater than or equal to 0, the center tap being connected to the first inductor and the second inductor by a via stack at the node,
wherein the first inductor overlays the second inductor with a shift in a first direction of approximately 40% to 60% of a metal width of each of the first inductor and the second inductor.

2. The T-coil IC of claim 1, wherein n is 1⅞+0.5 z turns, where z is an integer greater than or equal to 0.

3. The T-coil IC of claim 2, wherein z is equal 0, and the first inductor and the second inductor each have 1⅞ turns.

4. The T-coil IC of claim 2, wherein z is equal 1, and the first inductor and the second inductor each have 2⅜ turns.

5. The T-coil IC of claim 1, wherein:
the first inductor has a first inductor first end and a first inductor second end, the first inductor second end being connected to the center tap at the node; and
the second inductor has a second inductor first end and a second inductor second end, the second inductor first end being connected to the center tap at the node.

6. The T-coil IC of claim 5, wherein the node at which the center tap is connected to both the first inductor second end and the second inductor first end is located in a central portion within both the first inductor and the second inductor.

7. The T-coil IC of claim 5, wherein there is no bridge capacitor connected between the first inductor first end and the second inductor second end, and an effective bridge capacitance of the T-coil IC is approximately 25 fF.

8. The T-coil IC of claim 1, wherein y is equal to one of 0, 1, 2, or 3.

9. The T-coil IC of claim 1, wherein the shift in the first direction is approximately 50% of the metal width of each of the first inductor and the second inductor.

10. The T-coil IC of claim 1, wherein the first inductor and the second inductor each comprises segments that extend in a first direction and in a second direction orthogonal to the first direction, and wherein the segments at an edge of the first inductor and the second inductor that extend in the first direction completely overlay each other, and the segments at an edge of the first inductor and the second inductor that extend in the second direction overlay each other with a shift of approximately 40% to 60% of a metal width of each of the first inductor and the second inductor.

11. The T-coil IC of claim 10, wherein the shift is approximately 50% of the metal width of each of the first inductor and the second inductor.

12. The T-coil IC of claim 1, wherein:
the first inductor comprises a first inductor first segment extending in a second direction, a first inductor second segment connected to the first inductor first segment and extending in a first direction, a first inductor third segment connected to the first inductor second segment and extending in the second direction, a first inductor fourth segment connected to the first inductor third segment and extending in the first direction, a first inductor fifth segment connected to the first inductor fourth segment and extending in the second direction, a first inductor sixth segment connected to the first inductor fifth segment and extending in the first direction, a first inductor seventh segment connected to the first inductor sixth segment and extending in the second direction, and a first inductor eighth segment connected to the first inductor seventh segment and extending in the first direction;
the second inductor comprises a second inductor first segment extending in the second direction, a second inductor second segment connected to the second inductor first segment and extending in the first direction, a second inductor third segment connected to the second inductor second segment and extending in the second direction, a second inductor fourth segment connected to the second inductor third segment and extending in the first direction, a second inductor fifth segment connected to the second inductor fourth segment and extending in the second direction, a second inductor sixth segment connected to the second inductor fifth segment and extending in the first direction, a second inductor seventh segment connected to the second inductor sixth segment and extending in the second direction, and a second inductor eighth segment connected to the second inductor seventh segment and extending in the first direction; and
the first inductor first segment primarily overlays the second inductor third segment, the first inductor second segment primarily overlays the second inductor second segment, the first inductor third segment primarily overlays the second inductor first segment, the first inductor fourth segment primarily overlays the second inductor fourth segment, the first inductor fifth segment primarily overlays the second inductor seventh segment, the first inductor sixth segment primarily overlays the second inductor sixth segment, and the first inductor seventh segment primarily overlays the second inductor fifth segment.

13. The T-coil IC of claim 12, wherein the first inductor eighth segment and the second inductor eighth segment primarily have no overlay.

14. The T-coil IC of claim 13, wherein the first inductor first segment primarily overlays the second inductor third segment with a shift of s % of a metal width of the first inductor and the second inductor, the first inductor second segment primarily overlays the second inductor second segment without a shift, the first inductor third segment primarily overlays the second inductor first segment with the shift of s % of the metal width of the first inductor and the second inductor, the first inductor fourth segment primarily overlays the second inductor fourth segment without a shift, the first inductor fifth segment primarily overlays the second inductor seventh segment with the shift of s % of the metal width of the first inductor and the second inductor, the first inductor sixth segment primarily overlays the second inductor sixth segment without a shift, and the first inductor seventh segment primarily overlays the second inductor fifth segment with the shift of s % of the metal width of the first inductor and the second inductor, where 40% ≤s≤60%.

15. The T-coil IC of claim 14, wherein s is approximately 50% of the metal width of the first inductor and the second inductor.

16. The T-coil IC of claim 12, wherein:
the first inductor further comprises a first inductor ninth segment connected to the first inductor eighth segment and extending in the second direction, and a first inductor tenth segment connected to the first inductor ninth segment and extending in the first direction;
the second inductor further comprises a second inductor ninth segment connected to the second inductor eighth segment and extending in the second direction, and a second inductor tenth segment connected to the second inductor ninth segment and extending in the first direction; and the first inductor eighth segment primarily overlays the second inductor eighth segment.

17. The T-coil IC of claim 16, wherein the first inductor ninth segment, the second inductor ninth segment, the first inductor tenth segment, and the second inductor tenth segment primarily have no overlay.

18. The T-coil IC of claim 17, wherein the first inductor eighth segment primarily overlays the second inductor eighth segment without a shift.

19. The T-coil IC of claim 1, wherein x is 15.

20. The T-coil IC of claim 1, wherein the T-coil IC is on an IC, and the center tap is connected to an electrostatic discharge (ESD) device on the IC.

21. The T-coil IC of claim 1, wherein a coupling coefficient k of the T-coil IC is approximately 0.5.

* * * * *